United States Patent
Kamijo

(10) Patent No.: US 6,324,053 B1
(45) Date of Patent: Nov. 27, 2001

(54) WEARABLE DATA PROCESSING SYSTEM AND APPAREL

(75) Inventor: Noboru Kamijo, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/437,898

(22) Filed: Nov. 9, 1999

(51) Int. Cl.$^7$ .................................................. H05K 7/02
(52) U.S. Cl. .............................. 361/683; 361/685; 2/905; 2/264
(58) Field of Search ................................ 361/680–683, 361/685, 724–727; 2/905, 336, 264; 219/24

(56) References Cited

U.S. PATENT DOCUMENTS

| | | | |
|---|---|---|---|
| 1,691,472 | * 11/1928 | Graham et al. | 219/211 |
| 2,287,915 | * 6/1942 | Taylor | 219/211 |
| 2,329,766 | * 9/1943 | Jacobsen | 219/211 |
| 3,729,613 | * 4/1973 | Deloire et al. | 219/211 |
| 4,335,589 | * 6/1982 | Flasher | 66/202 |
| 4,404,460 | * 9/1983 | Kerr | 219/211 |
| 4,856,299 | * 8/1989 | Bryant | 66/202 |
| 4,876,724 | * 10/1989 | Suzuki | 381/187 |
| 5,105,067 | * 4/1992 | Brekkestran et al. | 219/497 |
| 5,416,310 | * 5/1995 | Little | 235/462 |
| 5,484,983 | * 1/1996 | Roell | 219/545 |
| 6,014,773 | * 1/2000 | Banks | 2/69 |
| 6,137,675 | * 10/2000 | Perkins | 361/679 |

FOREIGN PATENT DOCUMENTS

2221608 * 2/1990 (GB) .............................. B63C/11/28

* cited by examiner

*Primary Examiner*—Leo P. Picard
*Assistant Examiner*—Anatoly Vortman
(74) *Attorney, Agent, or Firm*—George E. Grosser; Andrew Dillon

(57) ABSTRACT

A system and method for the electrical interconnection of the devices included in a wearable computer, so that a light cable network can be deployed that does not limit the body movements of a human being. A network is formed by attaching to clothing, as stitches, extremely fine conductive wire that is used to connect devices included in a wearable computer, wherein an I/O device and a computer system main body are separately located. As a result, conventional, complicated cabling is eliminated, which permits the free and natural movement of a human body, and reliable communications, for which a light cable network is used, are possible.

5 Claims, 7 Drawing Sheets

WEARABLE DATA PROCESSING SYSTEM AND APPAREL

BACKGROUND OF THE INVENTION

1. Technical Field

The present application relates to wearable data processing systems and in particular to a wearable data processing system with a wired network for system communications. Still more particularly, this application relates to an improved wearable data processing system with an integrated wired network in an individual's clothing.

2. Description of the Related Art

In the present computer environment, a good deal of attention has been focused on the term "wearable." Wearable computer systems are systems that can be worn by the computer operator on his or her body.

Wearable computers are well known in the art, in practice and in theory. However, as a consequence of recent developments in computer techniques, computers and peripheral I/O devices can now be produced that are small and light enough to be worn, and wearable computers are therefore becoming more practical for actual use.

When a prototype and an example "wearable computer" product were provided, problems arose of which designers of conventional devices were not aware. One of the problems concerns the cabling, i.e., the cables for a network, to be used for connecting the various devices of the "wearable computer." However, little prior art exists that can be cited when referring to a means for improving the cabling or for improving the network of cables employed for such a computer.

Currently, the following two specific methods are used for the cabling to be used for a network of cables for a "wearable computer." The first method is a method that provides for a human's body to be used as a conductor and for a network to be constituted by the transmission of a go very low current across the body. The second method is a method according to which individual devices are connected together by using conventional cables.

An example of the first method is PAN (Personal Area Network), the prototype of which was introduced by International Business Machines Incorporated (IBM). This prototype was developed by Thomas Twimerman at IBM's Alderman Research Center.

With PAN, data communication is performed by transmitting a low current (about one nano-ampere) across a human's body.

According to the first method, for which a weak radio wave is used, this network cabling method permits an operator to move about freely, but because the radio wave is so weak it tends to be adversely affected by external noise. If, however, a strong radio wave were to be employed, the possibility exists that radio interference could affect the operation of equipment being used by a nearby person, or that an erroneous operation could occur. In addition, were a strong radio wave to be used for military purposes, an enemy would be able to pinpoint the location of a specific person.

An example of the second method is a prototype wearable PC introduced by IBM Japan, Ltd., in September 1998. For this prototype, a conventional cable having a diameter of 2 to 3 mm is employed to connect devices.

Most of the wearable-computer products produced by associated companies employ the conventional cable for the connection of devices.

In some networks provided by the second method, a cable is clipped to clothing so as to not interfere with human body movements, and specific connections are enabled. However, for a wearable computer, since the main body of the PC (the controller) must communicate with individual devices, a star type connection is not adequate because the cable connections required for the controller and the devices are complicated. In addition, since a conventional cable having a diameter of several millimeters is used, and since the cable is quite long, the total weight is not inconsiderable.

FIG. 1 is a diagram showing the prior art and an operator who is wearing a wearable computer that employs a conventional cable.

A controller 107 controls the wearable computer. The controller 107 generally includes a processor, and performs the same functions as a current notebook PC. A cable 110 connects the controller 107 to the other devices, 101 to 106. This wiring is very complicated, and interferes with body movements, so that the network can not adequately be considered wearable.

The device 101 is a so-called HMD (Head Mounted Display). Necessary images are produced on a type of liquid crystal transmission display, while at the same time, the display, which is transparent, does not interfere with the operator's view to the front.

Such an HMD is already being produced by companies in the United States, and is actually in use in factories where airplanes are assembled and maintained.

The device 102 may be an RF (radio) communication device, or a GPS receiver. The device 103 is a radio communication device, such as a cellular telephone or a PHS. The device 104 is a watch (display watch) having a display function, or an input device for voice and characters. The device 109 is a storage device, such as a hard disk device (HDD) or a flash memory, and the device 106 is a sensor. The devices 101 to 106 are interconnected by special cables 110 to 114.

In the conventional wearable computer shown in FIG. 1, since many cables are used and its total weight is quite large (several kilograms), the movement of the body is accordingly limited.

Japanese Patent Application No. Hei 1-54877, submitted by Fujii Process Ltd., discloses a technique whereby a cabling pattern is formed by bonding a conductive member to the surface of clothing, such as shirts or trousers. This technique is similar to the present invention in so far as a cabling pattern is formed on or under the surface of the clothing. However, the technique disclosed by Fujii Process Ltd. does not teach the technical idea according to which wiring is attached to clothing by stitching, as in the present invention, and has, along with other prior art, the above described problems.

As another cabling method, infrared (IR) light can be used for communication. However, since when light is used for communication, the direct point-to-point communication must be maintained between a transmitter and a receiver, this type of network cabling is not practical for use with a "wearable computer."

In the case of the wearable PC that was introduced by IBM Japan, Ltd. in September in 1998, the weight of the main body (the controller), on which are mounted components providing the functions of a notebook PC, is only 299 g, including a battery, while the total weight of the cables used for the system is approximately 80 g, which is more than one quarter the weight of the main body. On the other hand, the main body of a notebook PC, which functions substantially the same as this wearable PC, weighs approximately 2 to 3 kg, and the weight of the cable, 80 g, is little or nothing when compared with that of the notebook PC.

When conventional cable is used for the wearable PC, as in the above example, the weight of the cables is important because the controller, including a CPU and various other devices, is very light.

In addition, although conventional cable having a diameter of several millimeters is flexible to a degree, body movements are somewhat limited when multiple cables are used, and it is difficult to describe such a network as "wearable."

It would therefore be desirable to provide a method for the electrical interconnection of the devices included in a wearable computer that does not limit the body movements of a human being.

SUMMARY OF THE INVENTION

It is therefore one object of the present invention to provide an improved wearable data processing system.

It is another object of the present invention to provide an improved wearable data processing system with a wired network for system communications.

It is another object of the present invention to provide an improved wearable data processing system with an integrated wired network in an individuals clothing.

The foregoing objects are achieved as is now described.

According to the preferred embodiment, a fine steel wire, which is coated with gold, copper, or other conductive material, is sewn into the seams of the garment. Various computer devices can be connected to the wired seams using clips. These devices can include a user display worn over the eyes as eyeglasses, a tactile input device worn on one or both hands, a main computer unit worn elsewhere on the body, a microphone worn over or near the mouth, a headset worn by the user, and other computer peripherals.

The above as well as additional objectives, features, and advantages of the present invention will become apparent in the following detailed written description.

DESCRIPTION OF THE DRAWINGS

The novel features believed characteristic of the invention are get forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

With reference now to the figures, and according to the preferred embodiment, a network is constituted by attaching to clothing, as stitches, extremely fine conductive wire used to connect devices included in a wearable computer, wherein an I/O device and a PC main body are separately located. As a result, conventional, complicated cabling is eliminated, which permits the free and natural movement of a human body, and reliable communications, for which a light cable network is used, are possible.

According to the preferred embodiment, specifically, the back collar of a shirt is gripped by a connection clip that is located at the distal end of a short cable originating at a camera mounted on the head of an operator. And using clips, a display device built into glasses is attached to the front collar, an operating sensor glove worn on the hand of the operator is attached to a sleeve, and the PC main body is attached to the waist of the operator's trousers. A sensor is attached to the shoe gripped by the clip at the trouser cuffs, When clips are used to connect the operator's shirt and trousers at the waist, a wearable computer is provided which permits an operator to move freely.

As is described above, since fine conductive wire is attached to cloth as stitches, or is inserted into threads to serve as a cable network, devices attached to the various parts of the body (the ankles, the waist, the head, the shoulders, the wrists, etc.) can be interconnected without interfering with the free movement of the body, and a light cable network is provided.

Since extremely fine conductive wire is used, the clothing is as comfortable to wear as is regular clothing, and it is washable. In addition, since seams are located at the edges of the clothing, connection clips can be attached anywhere.

An apparel cable network can be easily constructed for any type of clothing, such as shirts and trousers, for which the above described stitches are appropriate, and arbitrary pieces of clothing are available for the attachment of a wearable computer.

Figure 2:
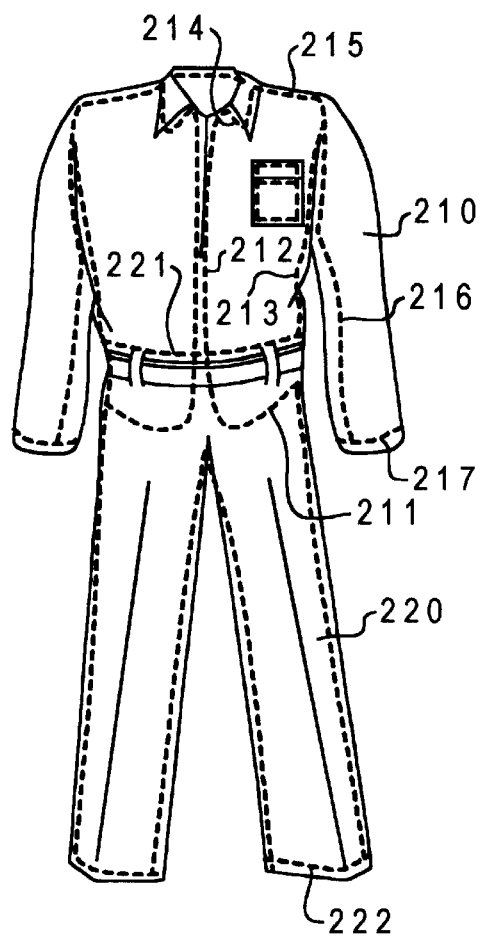
FIG. 2 is a diagram showing seams found in clothing (a shirt and trousers) commonly available on the market.

FIG. 2 is a diagram showing, by using broken lines, the seams in clothing that is commonly available on the market. But while a shirt (jacket) 210 and trousers 220 are shown as an example, such clothing is not limited to the men's garments shown in FIG. 2, and may include women's shirts and skirts, or other combinations.

Apparel is normally formed by using thread to sew several pieces of cloth together.

Observed closely, it can be seen that the seams of the shirt (jacket) 210 run from a lower end 211 at the waist along the front 212 and the sides 213 of the body to a collar 214, circling around the arm holes. The seams along the collar 214 and circling the arm holes are connected together by the shoulder seams 215, and the seams 216 running under the arms connect the seams circling the arm holes to the lower sleeve edges 217.

For the trousers 220, the seam 221 runs around the front and the back at the waist and is connected by seams is along the sides of the trouser legs to the seams 222 at the trouser cuffs.

It is apparent that both the shirt 210 and the trousers 220 are well supplied with seams, and that the seams would provide adequate locations for the installation of cables for a network to be used by a wearable computer attached to the body.

Figure 3:
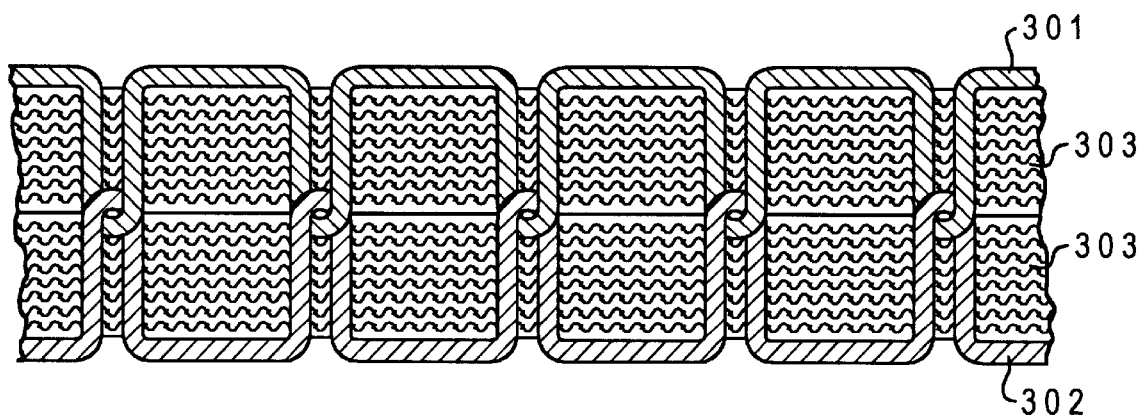
FIG. 3 is a cross-sectional side view of a seam 201 in FIG. 2.

FIG. 3 is a side cross-sectional view of a seam indicated by a broken line in FIG. 2. When an ordinary sewing machine is used, it sews pieces of cloth together as is shown in FIG. 3, while linking together a needle thread and a bobbin thread.

Specifically, a needle thread 301 (shaded portion) always runs above the center of a fabric 303, and a bobbin thread 302 (striped portion) always runs below the center of the fabric 303. Therefore, the needle thread 301 is not visible at the lower surface of the fabric 303, and the bobbin thread 302 is not visible at the upper surface of the fabric 303.

An example conductive thread that is so fine and flexible that it can be used for sewing is Cipher, produced by Kobe Steel, Ltd. Cipher conductive wire (Fe—C—Si—Mn) is a strong, flexible, and very fine steel wire, having a diameter of 15 to 100 $\mu$m, that can resist the linear stress imposed by a pulling force. This wire can be coated with an insulating material, or can be plated with a conductive material, such as gold or silver, and is adequate for use as a conductive thread for the present invention. Of course, those of skill in the art will readily identify suitable substitutes for this particular wire, and these are expected to fall within the scope of the invention.

As is apparent from FIGS. 2 and 3, if the sewing of a shirt and trousers is properly performed using an insulation coated conductive thread (wire), the main portions of the body can be electrically connected using a pair of signal lines (or a single signal line) provided as stitching in the shirt and the trousers.

When the shirt and the trousers are connected together at the waist, a network is provided across which are connected the primary portions of the body, which are the surface dimensions of the body. Even if the shirt and the trousers are not connected, at the least, independent networks for the upper body and the lower body can be provided. According to the use to which the current wearable computer has been put, the network for the upper body is particularly important as shown, e.g., in FIG. 1).

Figure 4:
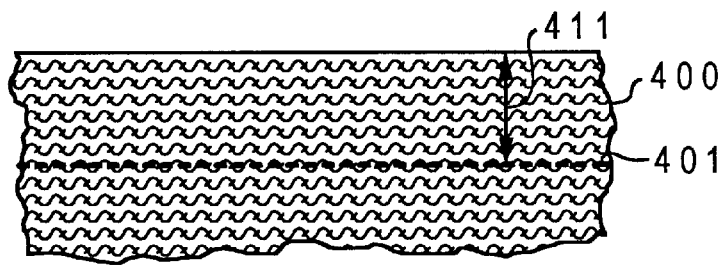
FIG. 4 is a diagram showing the positional relationship of a fabric and an extremely fine conductive wire when a network is formed in clothing using the wire, in accordance with a preferred embodiment of the present invention.
Figure 5:
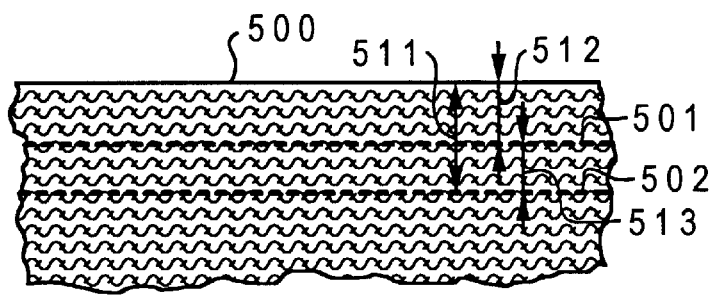
FIG. 5 is a diagram showing the positional relationship of a fabric and extremely fine conductive wires when a network is formed in clothing using the wires, in accordance with a preferred embodiment of the present invention.

FIGS. 4 and 5 show the positional relationships of clothing fabric and very fine conductive wire when networks are formed by passing the wire through apparel.

FIG. 4 illustrates a single-stitching case where a network is to be formed using a single wire which internally includes two insulated conductive wires, or by a needle thread and a bobbin thread. FIG. 5 illustrates a double-stitching case where a network is to be formed using two seams, i.e., two parallel needle threads (or bobbin threads) at the surface of the fabric.

In FIG. 4, a conductive wire 401 on the exterior is indicated by a broken line, and a conductive wire on the interior is not shown.

For both a network with a single seam (internally includes two wires), and for a network formed with a needle thread and a bobbin thread, the conductive wires are located at a predetermined distance 411 from the edge of the fabric 400.

Although the connection method is complicated, a plurality of super-fine conductive wires can be assembled, within the abilities of one of ordinary skill in the art, with sewing thread that can transmit multiple signals.

Further, twisted pairs of such threads can be used to improve the reliability of the network. In addition, super-fine conductive wire can not only be used for sewing a seam, but can also be woven into the fabric itself, even though this would increase the weight, so that all of the fabric could be used for transmission paths.

The fabric (cloth) for the present invention may be either a natural material or an artificial material.

In FIG. 5, two parallel conductive lines 501 and 502 are indicated by broken lines. The conductive lines 501 and 502, stitched in the fabric 500, are separated by a predetermined distance 513, and are positioned at the respective predetermined distances 511 and 512 from the edge of the fabric 500.

When the positions of the conductive wires are designated as shown in FIGS. 4 and 5, the connection to the wires of devices by using connection clips is easily performed.

When it is difficult to sew clothing without cutting threads that are in the way, to reconnect the ends of the needle thread and the ends of the bobbin thread, they may be tied together.

Furthermore, a network can be formed that uses, as a pair of signal lines, the two seams provided by double stitching.

In addition, when a piece of conductive cloth is used for connections, it is stitched together in such a way that different seams are joined together, so that all the seams can be connected electrically.

Extremely fine conductive wire can be used as the warp and the weft of a fabric, and when garment parts composed of this fabric are sewed together, network connections can be made. These connections are ensured by providing a plurality of seams. When the wires have been coated with an insulating material, to enable the networks to be connected together electrically, part of the insulating coat can be removed by applying a little release agent to portions of the wires at locations at which they intersect.

When stitches on the external and internal sides at all the edges of the clothing are aligned, a proper connection is ensured merely by gripping the clothing with clips, without any consideration being given to polarity.

In order to easily attach a device to a part of the network, a convenient location is one where the fabric is thick relative to a thread, or one, such as a collar, where several layers of fabric are used.

Figure 6:
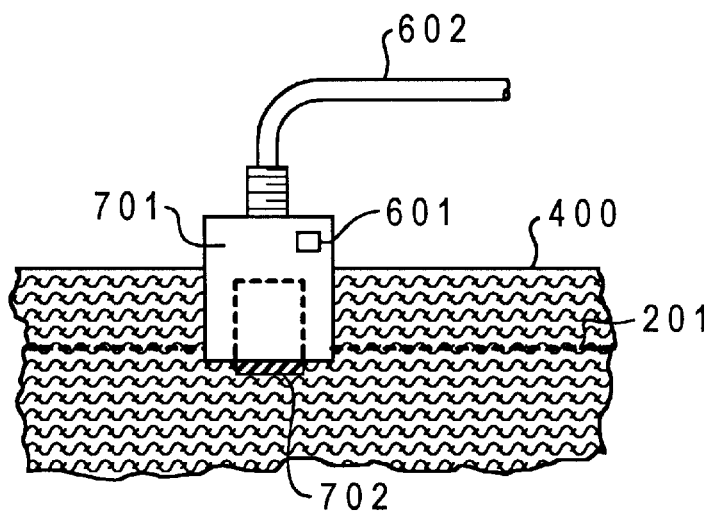
FIG. 6 is a diagram showing a clip 701, one of which is provided for each device to effect a connection to a network, in accordance with a preferred embodiment of the present invention.

FIG. 6 shows a clip used to connect a device to a network according to the present invention.

A conductive wire 201 is either the conductive wire 401, or the wires 501 and 502, as described with reference to either FIG. 4 or FIG. 5. For convenience sake, only one wire is shown. In the following description, it is assumed that the single wire includes two parallel conductive wires, such as the wires 501 and 502.

Each device is electrically (or optically) connected, by a clip 701, to the conductive wire 201 at the seam in the fabric.

Clips 701 are connected to individual devices via cables 602, so that the devices are joined together to form a network. It is preferable that a cable 602 be as thin and as light as possible.

It is preferable that the clip 701 includes display means, such as a connection check LED, that is used to confirm that the clip 701 is securely connected to the conductive wire 201. That is, when the device connected to the cable 602 is securely connected to the conductive line 201 by the clip 701, display means (an indicator light) 601 is turned on, and blinks. When the display means 601 is not turned on or it does not function as it should, it is assumed that the clip 701 is not properly connected to the conductive wire 201 and that the user should try again to obtain a good connection.

Figure 7:
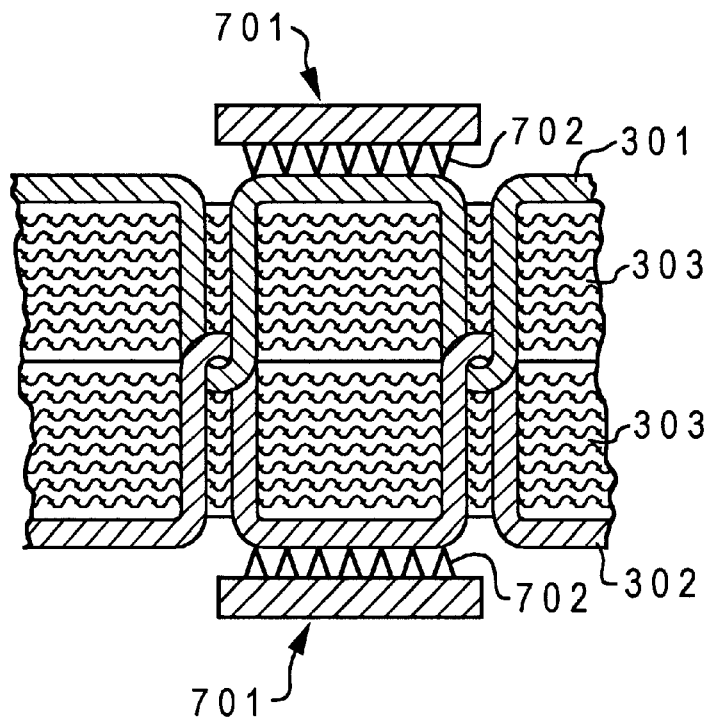
FIG. 7 is a cross-sectional view of the clip 701, fabric 303 and conductive wires 301 and 302 shown in FIG. 6, in accordance with a preferred embodiment of the present invention.

FIG. 7 is a cross-sectional view illustrating the relationship of the connection clip 701, the fabric 303 and the conductive wires 301 and 302 shown in FIG. 6.

Conductive rubber 702, equipped with needle-like projections, are fastened to both of the internal sides of the clip 701. Such a conductive sheet is, for example, the GB-Matrix produced by Shinetsu Polymer Co., Ltd.

Since the needle thread 301 always appears on the outer surface of the fabric and the bobbin thread 302 appears on the inner surface, to connect a device to the network, the portion of the fabric at which a device is to be attached is gripped from both sides by a clip 701.

Figure 8:
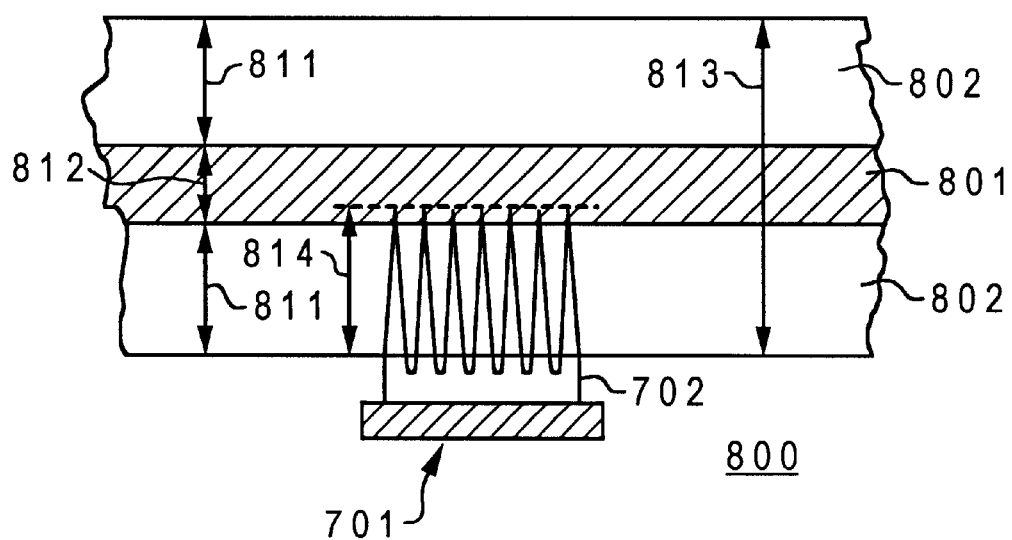
FIG. 8 is an enlarged diagram showing the connection state for the clip 701 and the conductive wire shown in FIG. 7, in accordance with a preferred embodiment of the present invention.

FIG. 8 is an enlarged diagram showing the state when the clip 701 in FIG. 7 is connected to a conductive wire 800. The needles 702 on one side of the clip 701 penetrate an insulating coat 802 and are retained in a conductive wire 801.

The conductive wire 800 has a dual structure wherein the insulating coat 802 is applied to the surface of the conductive wire 801.

Multiple needles 702 are formed on the conductive rubber of the clip 701. To connect the clip 701 to the network, the needles 702 penetrate the insulating coat 802 until they reach the conductive wire 801. If a conductive wire is not coated with an insulating film, the needles are connected directly to the conductive wire.

It is preferred, therefore, that the height of the needles 702 be greater than the thickness of the insulating coat 802 and less than the total diameter 813 of the conductive wire, and that the intervals between the needles 702 be smaller than the diameter of the conductive wire 801.

Figure 9:
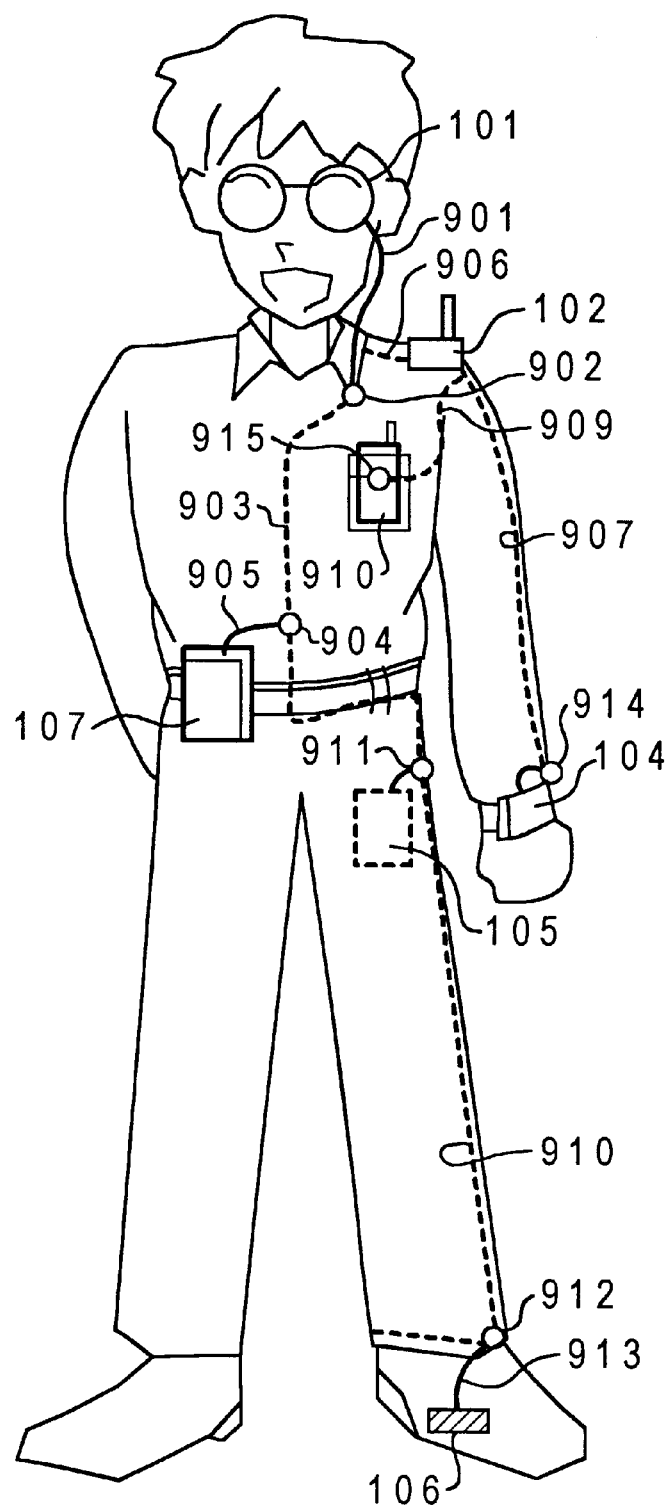
FIG. 9 is a diagram showing the general appearance of an operator and of a wearable computer worn by the operator, in accordance with a preferred embodiment of the present invention.

FIG. 9 is a diagram showing an example where the preferred embodiment is implemented for communications between the elements of a prior-art wearable data processing system.

Figure 1:
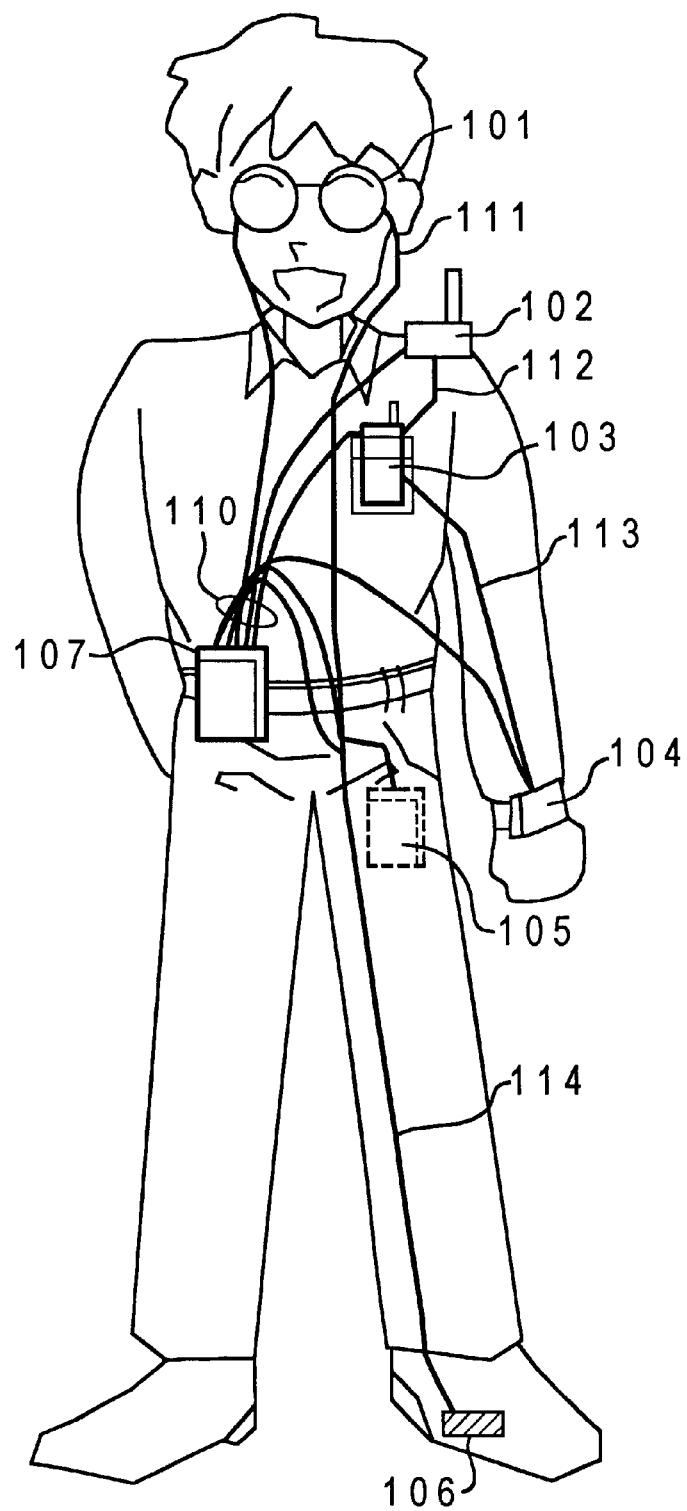
FIG. 1 is a diagram showing the general appearance of an operator and of a conventional wearable computer worn by the operator.

As is apparent from a comparison of FIGS. 1 and 9, although the same devices are attached to the body in FIGS. 1 and 9, the distribution of the cables in FIG. 1 is complicated and restricts the free movement of the body, while except for the portions at sites close to the devices, the cables in FIG. 9 do not appear externally and do not restrict the free movement of the body.

In addition, since the conventional cable is not used, the total weight is reduced considerably.

Assuming that a total of 10 m of cable is required, an ordinary conventional cable will weigh approximately 300 g, while the weight of the cable of the preferred embodiment will be only 1 g or less.

Furthermore, the diameter of the conventional cable is several millimeters, while the conductive wire of the preferred embodiment is approximately 100 μm. Therefore, the thickness of the conventional cable is several tens times that of the conductive wire of the preferred embodiment. Further, since the cable is thicker, and therefore less flexible, it tends to restrict body movements.

Since when sewing, the needle thread and the bobbin thread are linked together with the fabric held between them, the pulling force applied is directly reduced, and the threads are able to resist the linear stress imposed and will not break. In addition, since the surfaces of the threads are coated with an insulating film, the fabric is washable.

Figure 10:
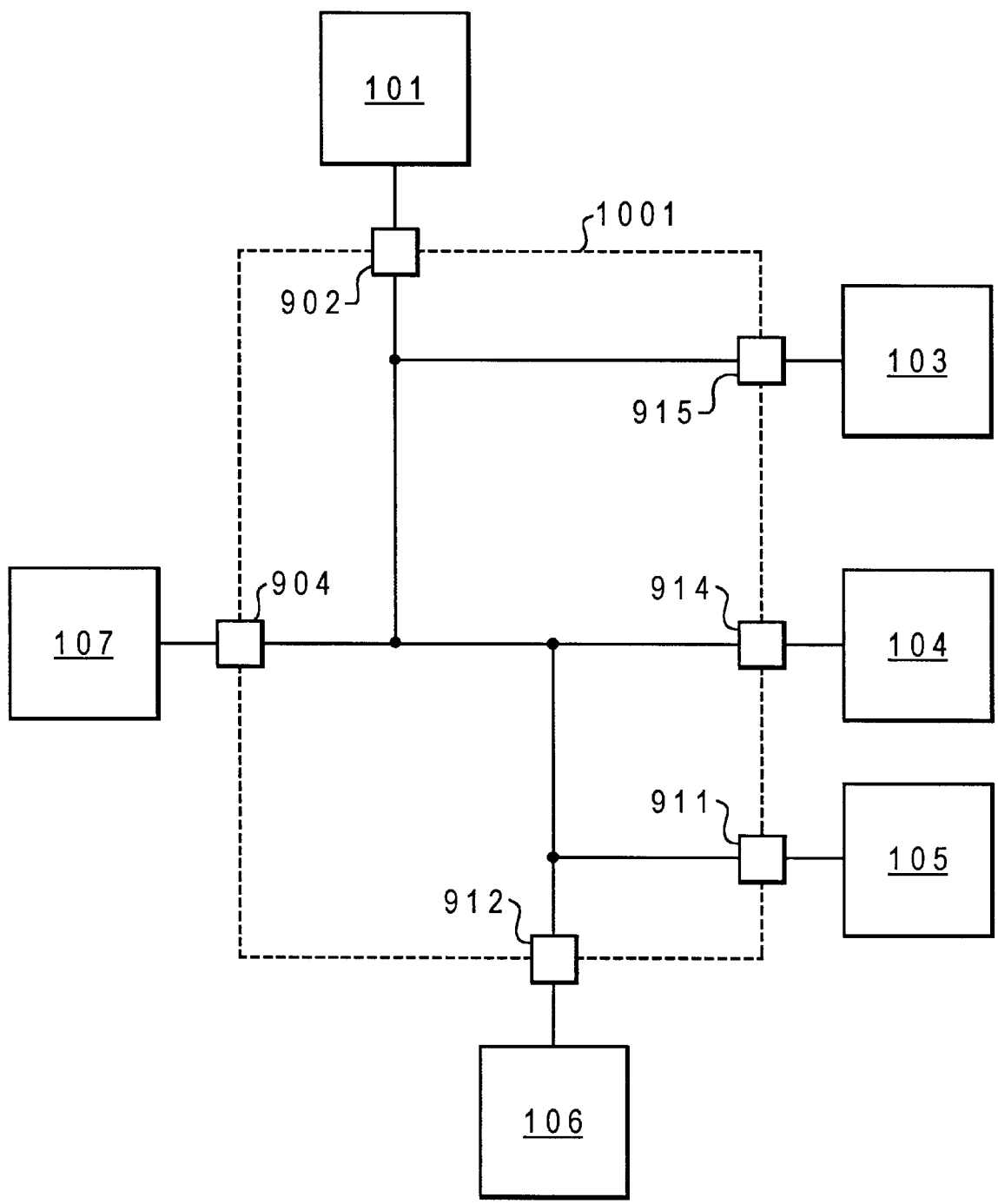
FIG. 10 is a diagram showing the general arrangement of a network, in accordance with a preferred embodiment of the present invention.

FIG. 10 is a diagram showing the cabling as a network when a electrical network as described in the preferred embodiment is employed.

Devices 101 to 107 are connected to a network cable 1001 via connection clips 902, 904, 911, 912, 914, and 915, which are connected to the individual devices.

Protocols, such as USB, ethernet and IEEE1394, that enable one-to-multiple or multiple-to-multiple communication are adequate for the example in FIG. 10. It should be noted that when the characteristic of the cable does not conform to one of these protocols a physical layer for each protocol may be required.

When only two devices are to be connected, interfaces inherent to them may be used instead of a general protocol. When, for example, one of the two devices transmits an analog audio signal and the other device receives this signal, the analog audio signal can be transmitted unchanged to the network cable.

When two conductive wires are employed, one of them can serve as a signal line and the other as a ground line, or the two wires can be differential lines, i.e., a positive line and a negative line.

A network connection can be formed that can cope with any type, such as the bus, the star and the ring type, in accordance with the stitching style and the number of filaments mixed with threads.

Figure 11:
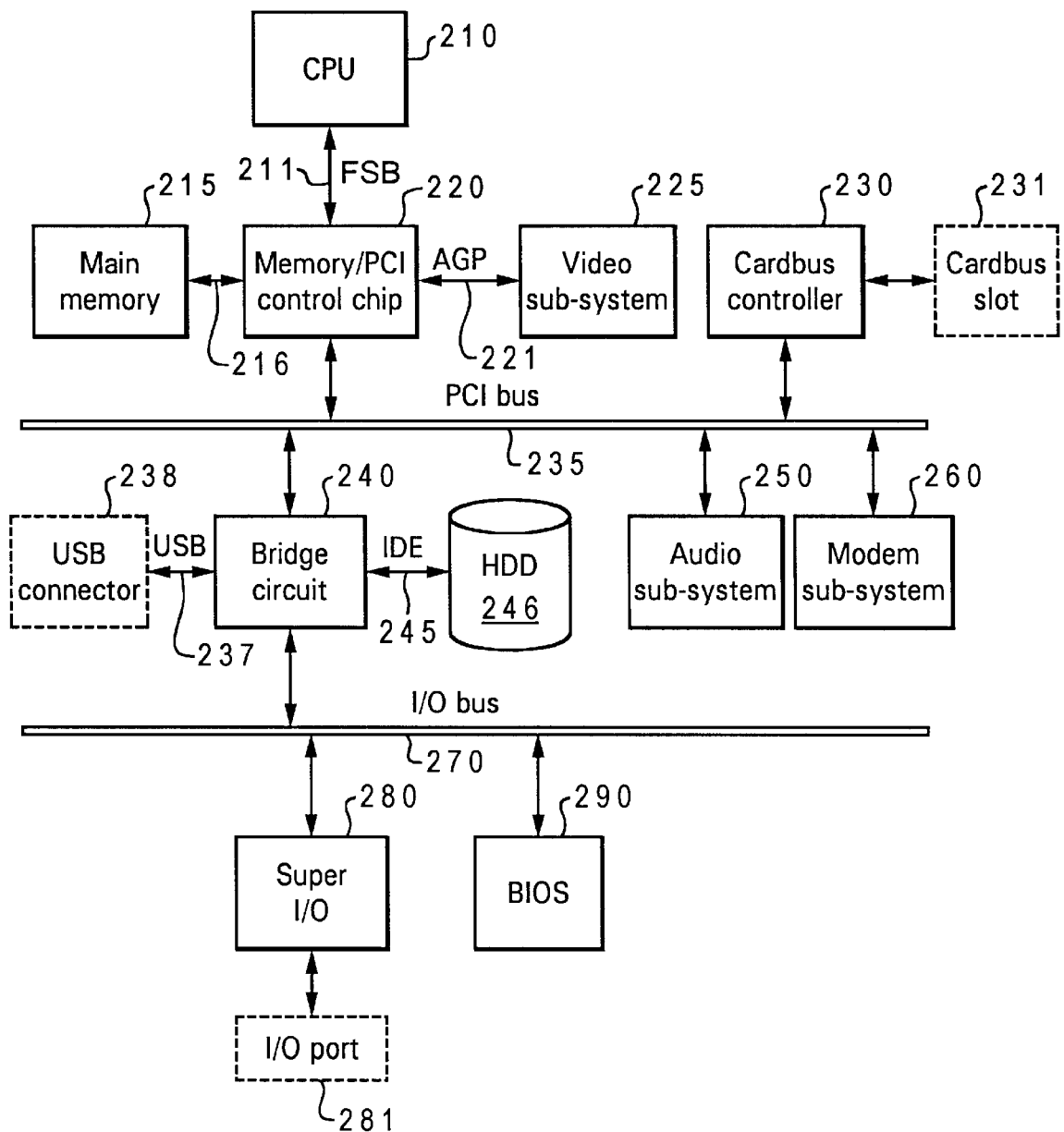
FIG. 11 is a block diagram illustrating a controller device, in accordance with a preferred embodiment of the present invention.

FIG. 11 is a specific diagram illustrating the hardware arrangement for the individual sub-systems of an adequate controller device for the present invention.

The controller device comprises, in the preferred embodiment: a CPU 210, which is the brain of the entire system; a bridge circuit (host-PCI bridge), which is called a memory/PCI control chip 220 for connecting an FSB 211, which is a direct processor connection bus, to a FCI bus 235; a main memory 215; a video sub-system 225; a cardbus controller 230; a bridge circuit (PCI-I/O bridge) 240 for connecting the PCI bus 235 to an I/O bus 270; an IDE hard disk drive (HDD) 246; a USB port 238; a ROM 290; and a Super I/O controller 280. An audio sub-system 250 and a modem sub-system 260 may be included as optional components.

The USB supports a function (hot plugging function) for inserting and removing additional peripheral devices (USB device) while the power is on, and a function (a plug and play function) for automatically identifying a peripheral device that is added and for re-setting the system configuration. A maximum of 63 USB devices can be connected through a single USB port by daisy-chaining the devices together, according to the present USB specification. Example USB devices are a keyboard, a mouse, a joystick, a scanner, a printer, a modem, a display monitory and a tablet. A network communication port, such as an ethernet port or an IEEE1394 port, may be included instead of the USB port.

To constitute the controller device, many electric circuits other than those shown in FIG. 11 may be required, and not all the sub-systems shown in FIG. 11 will always be necessary. But since these application conditions are well known to one having ordinary skill in the art, and are not related to the subject of the present invention, no further explanation for them will be given in these specifications. Also, to prevent the drawings from it becoming too complicated, only part of the connections that are established between the hardware blocks are shown.

With the above described arrangement of the present invention, since fine conductive wire is attached to cloth as stitches, or is inserted into threads to serve as a cable network, without using the radio wave, etc., devices attached to the various parts of the body (the ankles, the waist, the head, the shoulders, the wrists, etc.) can be interconnected without interfering with the free movement of the body, and a light cable network is provided.

Since extremely fine conductive wire is used, the clothing is as comfortable to wear as is regular clothing, and it is washable. In addition, since seams are located at the edges of the clothing, connection clips can be attached anywhere.

An apparel cable network can be easily constructed for any type of clothing, such as shirts and trousers, for which the above described stitches are appropriate, and arbitrary pieces of clothing are available for the attachment of a wearable computer.

While the invention has been particularly shown and described with reference to a preferred embodiment, it will be understood by those skilled in the art that various changes in form and derail may be made therein without departing from the spirit and scope of the invention.

What is claimed is:

1. A data processing system comprising:
   apparel worn by an operator;
   conductive wiring provided as stitches applied to said apparel, wherein the conductive wiring comprises two conductive wires, and wherein the two conductive wires are provided in parallel as stitches applied to external and internal surfaces of the apparel at locations separated by predetermined distances from the edges of the apparel;
   input/output means to be operated by said operator and connected to said conductive wiring; and
   signal processing means connected to said input/output means via said conductive wiring.

2. The data processing system of claim 1, wherein the conductive wiring is comprised of steel wires.

3. The data processing system of claim 1, wherein the conductive wiring is coated with an insulating film.

4. The data processing system of claim 1, wherein the conductive wiring comprises two individually insulated wires.

5. The data processing system of claim 1, wherein the two conductive wires are provided in parallel as stitches applied to external and internal surfaces of the apparel at locations separated by first and second distances from the edges of the apparel.

* * * * *